(12) United States Patent
Horii et al.

(10) Patent No.: US 9,571,615 B2
(45) Date of Patent: Feb. 14, 2017

(54) ELECTRONIC APPARATUS, PANEL UNIT, AND UNIT FOR ELECTRONIC APPARATUS

(71) Applicant: KYOCERA CORPORATION, Kyoto (JP)

(72) Inventors: Seiji Horii, Yokohama (JP); Kenichi Ozasa, Yokohama (JP); Hayato Mizuno, Higashiosaka (JP); Hiroto Yahagi, Yokohama (JP); Ryosuke Kobayashi, Daito (JP)

(73) Assignee: KYOCERA Corporation, Kyoto (JP)

( * ) Notice: Subject to any disclaimer, the term of this patent is extended or adjusted under 35 U.S.C. 154(b) by 46 days.

(21) Appl. No.: 14/388,769

(22) PCT Filed: Mar. 27, 2013

(86) PCT No.: PCT/JP2013/002093
§ 371 (c)(1),
(2) Date: Sep. 26, 2014

(87) PCT Pub. No.: WO2013/145740
PCT Pub. Date: Oct. 3, 2013

(65) Prior Publication Data
US 2015/0086047 A1 Mar. 26, 2015

(30) Foreign Application Priority Data

Mar. 29, 2012 (JP) ................................ 2012-076829
Mar. 29, 2012 (JP) ................................ 2012-076965
(Continued)

(51) Int. Cl.
*H04M 1/02* (2006.01)
*H01L 41/23* (2013.01)
(Continued)

(52) U.S. Cl.
CPC ............ *H04M 1/0268* (2013.01); *H01L 41/23* (2013.01); *H04R 7/045* (2013.01); *H04R 7/10* (2013.01);
(Continued)

(58) Field of Classification Search
CPC ..... H04R 17/00; B06B 1/0603; B06B 1/0611; H04L 41/22; H04L 41/23; H04L 41/25; H04L 41/27; H04L 41/31
(Continued)

(56) References Cited

U.S. PATENT DOCUMENTS 7,555,133 B2* 6/2009 Hama .................. B06B 1/0618
381/152
7,750,536 B2* 7/2010 Chaggares ............. B06B 1/067
310/334
(Continued)

FOREIGN PATENT DOCUMENTS

JP 2004-187031 A 7/2004
JP 2005-348193 A 12/2005
(Continued)

OTHER PUBLICATIONS

International Search Report; PCT/JP2013/002093; Jul. 2, 2013.
(Continued)

*Primary Examiner* — Jesse Elbin
(74) *Attorney, Agent, or Firm* — Studebaker & Brackett PC

(57) ABSTRACT

Excessive deformation of a piezoelectric element is reduced. An electronic apparatus 1 according to the present invention includes a panel 10, a piezoelectric element 30, a housing 60 for mounting the panel 10, and an intermediate member 80 attached to the piezoelectric element 30, wherein the intermediate member 80 and the panel 10 deform due to deformation of the piezoelectric element 30, thereby delivering an air conduction sound and a human body vibration sound to an object in contact with the panel 10 that is deforming.

24 Claims, 9 Drawing Sheets

(30) Foreign Application Priority Data

Mar. 29, 2012 (JP) .................................. 2012-077674
May 22, 2012 (JP) .................................. 2012-116803

(51) Int. Cl.
*H04R 7/04* (2006.01)
*H04R 7/10* (2006.01)
*B06B 1/06* (2006.01)
*H04R 17/00* (2006.01)

(52) U.S. Cl.
CPC .............. *B06B 1/0611* (2013.01); *H04R 17/00* (2013.01); *H04R 2460/13* (2013.01); *H04R 2499/11* (2013.01); *H04R 2499/15* (2013.01)

(58) Field of Classification Search
USPC ............... 381/152, 190, 306, 333, 388, 395; 455/575.1–575.9; 310/311, 322, 326, 327
See application file for complete search history.

(56) References Cited

U.S. PATENT DOCUMENTS

| | | | | |
|---|---|---|---|---|
| 7,822,215 B2 * | 10/2010 | Carazo | .................. | H04R 17/00 381/151 |
| 7,840,017 B2 * | 11/2010 | Isetani | ................. | B42D 15/022 310/322 |
| 2006/0227981 A1 | 10/2006 | Miyata | | |
| 2008/0122317 A1 * | 5/2008 | Fazzio | .................. | G01H 11/08 310/328 |
| 2010/0219722 A1 | 9/2010 | Onishi et al. | | |
| 2013/0101145 A1 * | 4/2013 | Wang | .................... | B06B 1/0603 381/191 |

FOREIGN PATENT DOCUMENTS

| | | | |
|---|---|---|---|
| JP | 2007-082009 | A | 3/2007 |
| JP | 2008-252878 | A | 10/2008 |
| WO | 2004/023199 | A1 | 3/2004 |
| WO | 2004/051967 | A1 | 6/2004 |
| WO | 2007/083497 | A1 | 7/2007 |
| WO | 2010/106736 | A1 | 9/2010 |

OTHER PUBLICATIONS

Written Opinion of the International Searching Authority; PCT/JP2013/002093; Jul. 2, 2013; with concise explanation.

Japanese Office Action; JP2014-014488; May 20, 2014; with concise explanation.

Japanese Office Action; JP2014-507434; Sep. 2, 2014; with concise explanation.

* cited by examiner

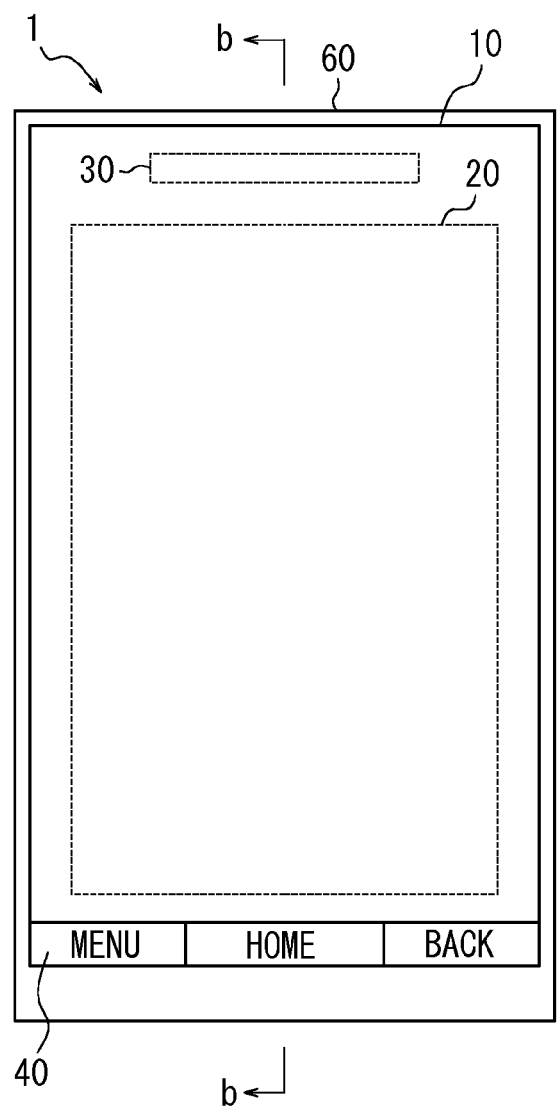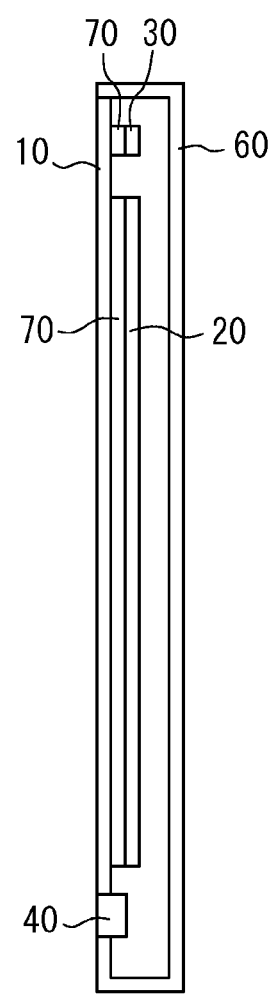

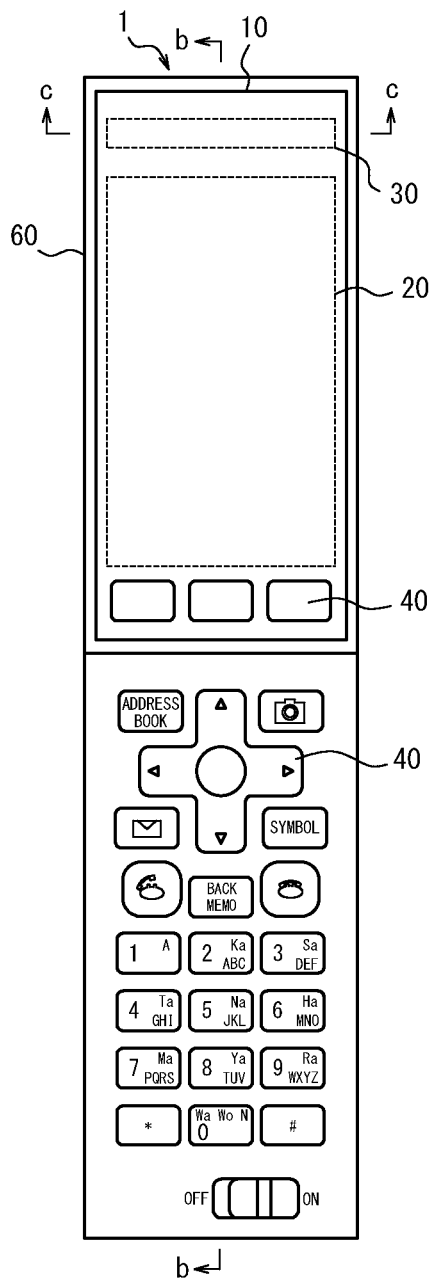
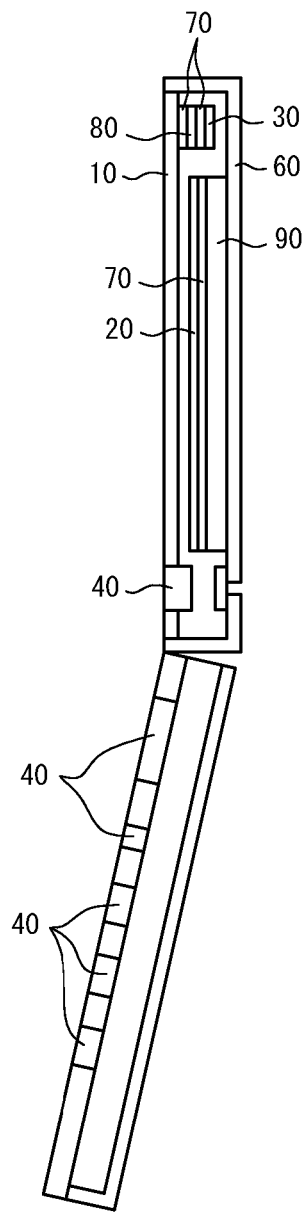
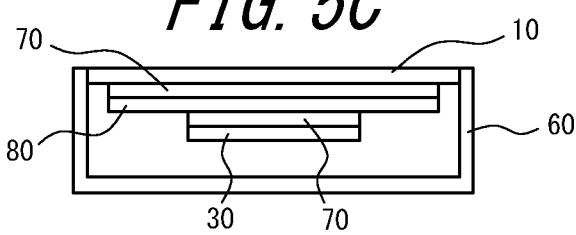

ELECTRONIC APPARATUS, PANEL UNIT, AND UNIT FOR ELECTRONIC APPARATUS

CROSS REFERENCE TO RELATED APPLICATIONS

This application claims priority to and the benefit of Japanese Patent Application No. 2012-077674 (filed on Mar. 29, 2012), Japanese Patent Application No. 2012-076829 (filed on Mar. 29, 2012), Japanese Patent Application No. 2012-076965 (filed on Mar. 29, 2012), and Japanese Patent Application No. 2012-116803 (filed on May 22, 2012), the entire contents of which are incorporated herein by reference.

TECHNICAL FIELD

The present invention relates to an electronic apparatus for vibrating a panel by applying a predetermined electrical signal (a sound signal) on a piezoelectric element and for delivering an air conduction sound and a human body vibration sound to a user by delivering the vibration of the panel to a user's body.

BACKGROUND ART

Patent Document 1 describes an electronic device such as a mobile phone that delivers an air conduction sound and a bone conduction sound to a user. Patent Document 1 also describes that the air conduction sound is a sound that is delivered to the auditory nerve of the user when vibration of the air caused by vibration of an object reaches the eardrum through the ear canal and vibrates the eardrum. Patent Document 1 further describes that the human body vibration sound is a sound that is delivered to the auditory nerve of the user via a part of a user's body (for example, the cartilage of the ear) in contact with an object being vibrating.

In the phone described in Patent Document 1, a vibrator in the form of a short rectangular plate made of a piezoelectric bimorph and a flexible material is attached to an outer surface of a housing via an elastic member. Patent Document 1 also describes that, upon application of a voltage on the piezoelectric bimorph of the vibrator, a piezoelectric material stretches in a longitudinal direction causing bending vibration of the vibrator and thus, when the user brings the vibrator into contact with the auricle, the air conduction sound and the human body vibration sound are delivered to the user.

RELATED ART DOCUMENT

Patent Document

Patent Document 1: Japanese Patent Application Laid-Open Publication No. 2005-348193

SUMMARY OF INVENTION

Technical Problem

The electronic apparatus described in Patent Document 1 does not consider measures against excessive deformation of a piezoelectric element of the vibrator.

An object of the present invention is to provide an electronic apparatus, a panel unit, and a unit for electronic apparatus that are capable of reducing damage to the piezoelectric element.

Solution to Problem

An electronic apparatus according to the present invention includes a panel, a piezoelectric element, a housing for attaching the panel thereto, and an intermediate member attached to the piezoelectric element, wherein the intermediate member and the panel deform due to deformation of the piezoelectric element, thereby delivering an air conduction sound and a human body vibration sound to an object in contact with the panel that is deforming.

The intermediate member is disposed between the panel and the piezoelectric element, and the piezoelectric element and the intermediate member may be attached together by a first joint member.

The intermediate member may be made of glass fibers and resin, metal fibers and resin, or carbon fibers and resin.

The panel may vibrate in a region larger than a region having a length corresponding to a distance from the inferior antihelix crus of the human ear to the antitragus and a width corresponding to a distance from the tragus to the antihelix.

The intermediate member may be attached to the panel by a second joint member.

The first joint member may be a non-thermocurable adhesive.

The first joint member may be a double-sided adhesive tape.

The second joint member may be the non-thermocurable adhesive.

The second joint member may be the double-sided adhesive tape.

The panel may be attached to the housing by a third joint member.

The third joint member may be the non-thermocurable adhesive.

The third joint member may be the double-sided adhesive tape.

The panel may partially or entirely constitute any one of a display panel, an operation panel, a cover panel, and a lid panel for allowing removal of a battery.

When the panel constitutes the display panel, the piezoelectric element may be disposed outside a display area for executing a display function.

The panel may deform in any region thereof to deliver the air conduction sound and the human body vibration sound.

The panel, in a vibration region thereof, includes a plurality of locations for vibrating in a direction intersecting with a main surface of the panel, in each of which a value of amplitude of the vibration may change with time from positive to negative or vice versa.

The intermediate member may be a member for reducing excessive deformation of the piezoelectric element.

The intermediate member may be a member for alleviating transmission of external force to the piezoelectric element.

The intermediate member may be made of metal.

A panel unit according to the present invention includes a piezoelectric element and an intermediate member attached to the piezoelectric element, wherein the intermediate member and a panel deforms due to deformation of the piezoelectric element, thereby delivering an air conduction sound and a human body vibration sound to an object in contact with the panel that is deforming.

The intermediate member may be a member for reducing excessive deformation of the piezoelectric element.

The intermediate member may be a member for alleviating transmission of external force to the piezoelectric element.

The intermediate member may be made of metal.

Also, an electronic apparatus according to the present invention includes a piezoelectric element, a panel vibrated by the piezoelectric element and thereby generates an air conduction sound and a vibration sound delivered via a human body, and a housing having the panel mounted thereon, wherein the piezoelectric element and the panel are attached together at both ends of a longitudinal direction of the piezoelectric element.

Further, an electronic apparatus according to the present invention includes a piezoelectric element, a panel vibrated by the piezoelectric element and thereby generates an air conduction sound and a vibration sound delivered via a human body, an intermediate member disposed between the piezoelectric element and the panel, and a housing having the panel mounted thereon, wherein the piezoelectric element and the intermediate member are attached together at both ends of a longitudinal direction of the piezoelectric element.

Further, an electronic apparatus according to the present invention includes a piezoelectric element, a panel vibrated by the piezoelectric element and thereby generates an air conduction sound and a vibration sound delivered via a human body, an intermediate member disposed between the piezoelectric element and the panel, and a housing having the panel mounted thereon, wherein the intermediate member and the panel are attached together at both ends of a longitudinal direction of the intermediate member.

Further, an electronic apparatus according to the present invention includes a piezoelectric element, a panel vibrated by the piezoelectric element and thereby generates an air conduction sound and a vibration sound delivered via a human body, an intermediate member disposed between the piezoelectric element and the panel, and a housing having the panel mounted thereon, wherein the piezoelectric element and the intermediate member are attached together at both ends of a longitudinal direction of the piezoelectric element, and the intermediate member and the panel are attached together at both ends of a longitudinal direction of the intermediate member.

The intermediate member may be a member for alleviating transmission of external force to the piezoelectric element.

The intermediate member may be a member for reducing damage to the piezoelectric element due to its curving.

The intermediate member may be a member for making total weight of the piezoelectric element and the intermediate member heavier than weight of the piezoelectric element alone.

The piezoelectric element may be of a bimorph or a laminated piezoelectric element.

The panel may vibrate in a region larger than a region having a length corresponding to a distance from the inferior antihelix crus of the human ear to the antitragus and a width corresponding to a distance from the tragus to the antihelix.

The attachment may be carried out by using a non-thermocurable adhesive.

The attachment may be carried out by using a double-sided adhesive tape.

The panel may be attached to the housing by a joint member.

The joint member may be a non-thermocurable adhesive.

The joint member may be a double-sided adhesive tape.

The panel may partially or entirely constitute any one of a display panel, an operation panel, a cover panel, and a lid panel for allowing removal of a battery.

When the panel constitutes the display panel, the piezoelectric element is disposed outside a display area for executing a display function.

The panel may deform in any region thereof to deliver the air conduction sound and the vibration sound.

The panel, in a vibration area thereof, includes a plurality of locations for vibrating in a direction intersecting with a main surface of the panel, in each of which a value of amplitude of the vibration may change with time from positive to negative or vice versa.

Further, an electronic device according to the present invention includes a piezoelectric element, a panel vibrated by the piezoelectric element and thereby generates an air conduction sound and a vibration sound delivered by vibration of a part of a human body, and a housing having the panel mounted thereon, wherein the piezoelectric element and a joint member having the piezoelectric element attached thereto are attached together at both ends of a longitudinal direction of the piezoelectric element, and an air space in the absence of the joint member is interposed between the both ends.

Further, a unit for electronic apparatus according to the present invention includes a piezoelectric element, and a panel vibrated by the piezoelectric element and thereby generates an air conduction sound and a vibration sound delivered by vibration of a part of a human body, wherein the piezoelectric element and the panel are attached together at both ends of a longitudinal direction of the piezoelectric element.

Further, a unit for electronic apparatus according to the present invention includes a piezoelectric element, a panel vibrated by the piezoelectric element and thereby generates an air conduction sound and a vibration sound delivered by vibration of a part of a human body, and an intermediate member disposed between the piezoelectric element and the panel, wherein the piezoelectric element and the intermediate member are attached together at both ends of a longitudinal direction of the piezoelectric element.

Further, a unit for electronic apparatus according to the present invention includes a piezoelectric element, a panel vibrated by the piezoelectric element and thereby generates an air conduction sound and a vibration sound delivered by vibration of a part of a human body, and an intermediate member disposed between the piezoelectric element and the panel, wherein the intermediate member and the panel are attached together at both ends of a longitudinal direction of the intermediate member.

Further, a unit for electronic apparatus according to the present invention includes a piezoelectric element, a panel vibrated by the piezoelectric element and thereby generates an air conduction sound and a vibration sound delivered by vibration of a part of a human body, and an intermediate member disposed between the piezoelectric element and the panel, wherein the piezoelectric element and the intermediate member are attached together at both ends of a longitudinal direction of the piezoelectric element, and the intermediate member and the panel are attached together at both ends of a longitudinal direction of the intermediate member.

Effect of the Invention

According to the electronic apparatus, the panel unit and the unit for electronic apparatus of the present invention, damage to the piezoelectric element may be reduced.

BRIEF DESCRIPTION OF DRAWINGS

FIG. 3 are diagrams illustrating a housing structure of an electronic apparatus according to a first embodiment;

FIG. 5 are diagrams illustrating a housing structure of an electronic apparatus according to a second embodiment;

DESCRIPTION OF EMBODIMENTS

Figure 1:
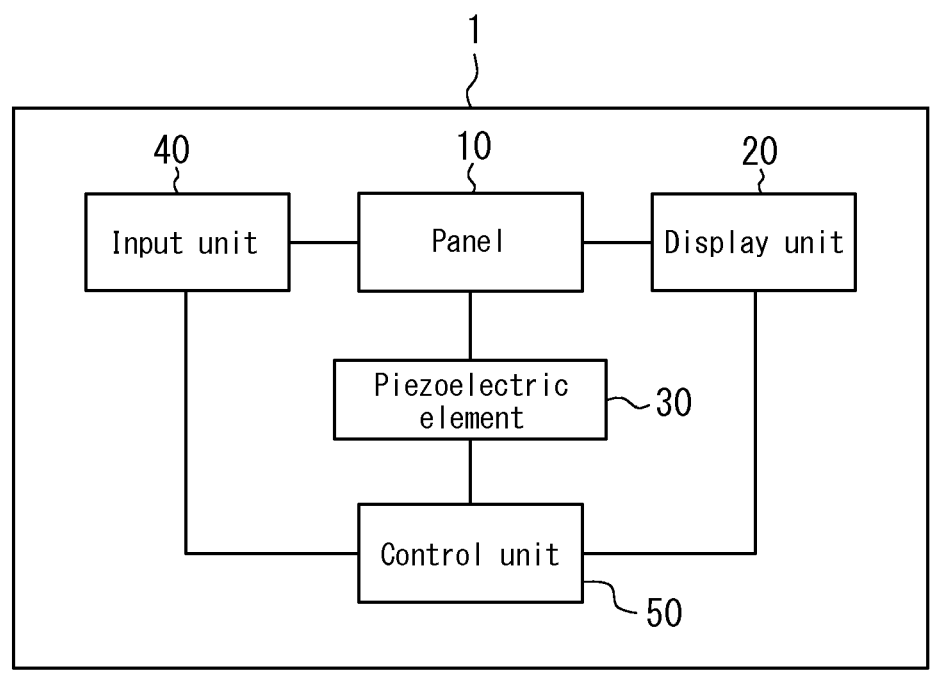
FIG. 1 is a diagram illustrating a functional block of an electronic apparatus according to one embodiment of the present invention.

Hereinafter, embodiments of the present invention will be described in detail with reference to the accompanying drawings. FIG. 1 is a diagram illustrating a functional block of an electronic apparatus 1 according to one embodiment of the present invention. The electronic apparatus 1 is a mobile phone (smart phone), for example, and includes a panel 10, a display unit 20, a piezoelectric element 30, an input unit 40, and a control unit 50.

The panel 10 is a touch panel for detecting a contact, or a cover panel and the like for protecting the display unit 20. The panel 10 is made of, for example, glass or synthetic resin such as acrylic and the like. The panel 10 preferably has a plate-like shape. The panel 10 may be a flat plate or a curved panel with a smoothly inclined surface. The panel 10 as the touch panel detects a contact by a user's finger, a pen, a stylus pen and the like. A detection method of the touch panel may be any one of an electrostatic capacitance method, a resistance film method, a surface acoustic wave method (or an ultrasound method), an infrared method, an electromagnetic induction method, a load detection method and the like.

The display unit 20 is a display device such as a liquid crystal display, an organic EL display, an inorganic EL display and the like. The display unit 20 is disposed on a rear side of the panel 10. The display unit 20 is disposed on the rear side of the panel 10 by using, for example, a joint member (for example, an adhesive). The display unit 20 may be attached to the panel 10 by the joint member (for example, the adhesive), or disposed spaced apart from the panel 10 and supported by a housing of the electronic device 1.

The piezoelectric element 30 is an element that, upon application of an electrical signal (a voltage), stretches or curves (bends) in accordance with an electromechanical coupling coefficient of a material constituting the piezoelectric element. The piezoelectric element may be made of, for example, ceramic or crystal. The piezoelectric element 30 may be a unimorph, a bimorph, or a laminated piezoelectric element. The laminated piezoelectric element includes a laminated unimorph element including laminated unimorphs (for example, 16 to 24 layers thereof), or a laminated bimorph element including laminated bimorphs (for example, 16 to 24 layers thereof). The laminated piezoelectric element has a multilayer structure including a plurality of dielectric layers made of, for example, PZT (lead zirconate titanate) and electrode layers disposed therebetween. The unimorph stretches upon application of the electrical signal (voltage), while the bimorph bends upon application of the electrical signal (voltage).

The piezoelectric element 30 is disposed on a rear surface of the panel 10 (an internal surface of the electronic apparatus 1). The piezoelectric element 30 is attached to the panel 10 by a joint member (for example, a double-sided adhesive tape). The piezoelectric element 30 may be attached to the panel 10 via an intermediate member (for example, sheet metal). The piezoelectric element 30 is disposed on the rear surface of the panel 10 and spaced apart from an internal surface of the housing by a predetermined distance. The piezoelectric element 30 is preferably spaced apart from the internal surface of the housing by the predetermined distance also when the piezoelectric element 30 is stretching or curving. That is, a distance between the piezoelectric element 30 and the internal surface of the housing is preferably greater than a maximum deformation amount of the piezoelectric element 30.

The input unit 40 receives an input operation from a user and is constituted by using, for example, an operation button (an operation key). When the panel 10 is the touch panel, the panel 10 may also receive the input operation from the user by detecting the contact by the user.

The control unit 50 is a processor for controlling the electronic apparatus 1. The control unit 50 applies a predetermined electrical signal (a voltage corresponding to a sound signal) to the piezoelectric element 30. The voltage applied to the piezoelectric element 30 by the control unit 50 may be, for example, ±15 V, which is greater than a voltage ±5 V applied by what is called a panel speaker used for the purpose of delivering sound by an air conduction sound as opposed to a human body vibration sound. Thereby, when the user presses the panel 10 against a user's body applying force of, for example, 3 N or greater (force of 5 N to 10 N), the panel 10 may generate sufficient vibration allowing generation of the human body vibration sound via a part of the user's body. Note that a level of the voltage to apply is appropriately adjustable based on fixing strength of the panel 10 to the housing or a supporting portion, or based on performance of the piezoelectric element 30. When the control unit 50 applies the electrical signal to the piezoelectric element 30, the piezoelectric element 30 stretches or bends in a longitudinal direction. At this time, the panel 10 having the piezoelectric element 30 attached thereto deforms following the stretch or bend of the piezoelectric element 30 and also vibrates. The panel 10 curves due to the stretch or bend of the piezoelectric element 30. The panel 10 is bent directly by the piezoelectric element 30. Note that "the panel 10 is bent directly by the piezoelectric element" is different from a phenomenon that, as employed by a conventional panel speaker, inertial force of a piezoelectric actuator composed of the piezoelectric element disposed inside a casing excites a specific region of the panel and deforms the panel. "The panel 10 is bent directly by the piezoelectric element" means that the stretch or bend (curve) of the piezoelectric element directly bends the panel via the joint member, or via the joint member and an intermediate member 80 described below. Thereby, the panel 10 generates the air conduction sound and also, when the user brings a part of the user's body (for example, the cartilage of the external ear) into contact with the panel 10, generates the human body vibration sound via the part of the user's body. For example, the control unit 50 may apply the electrical signal corresponding to a sound signal of voice of the other party so as to generate the air conduction sound and the human body vibration sound corresponding to the sound signal. The sound signal may be a ringtone, or music including songs. Also, the sound signal corresponding to the electrical signal may be based on music data stored in an internal storage of the electronic device 1 or music data stored in an external server and the like to be replayed via the network.

The panel 10 vibrates in an attaching region having the piezoelectric element 30 attached thereto, as well as in a region remote from the attaching region. The panel 10, in the region to vibrate, includes a plurality of portions that vibrate in a direction intersecting with a main surface of the panel 10, in each of which a value of amplitude of the vibration changes with time from positive to negative or vice versa. The panel 10, at a certain moment, vibrates in such a manner that regions with relatively large vibration amplitude and regions with relatively small vibration amplitude are seemingly distributed in a random or periodic manner in a substantially entire panel 10. That is, over the entire panel 10, vibrations of a plurality of waves are detected. In order to prevent attenuation of the vibration of the panel 10 as described above when the user presses the panel 10 against the user's body applying the force of, for example, 5 N to 10 N, the voltage applied to the piezoelectric element 30 by the control unit 50 may be ±15 V. Thereby, the user may hear the sound by bringing the region remote from the attaching region of the panel 10 into contact with the ear.

Figure 2:
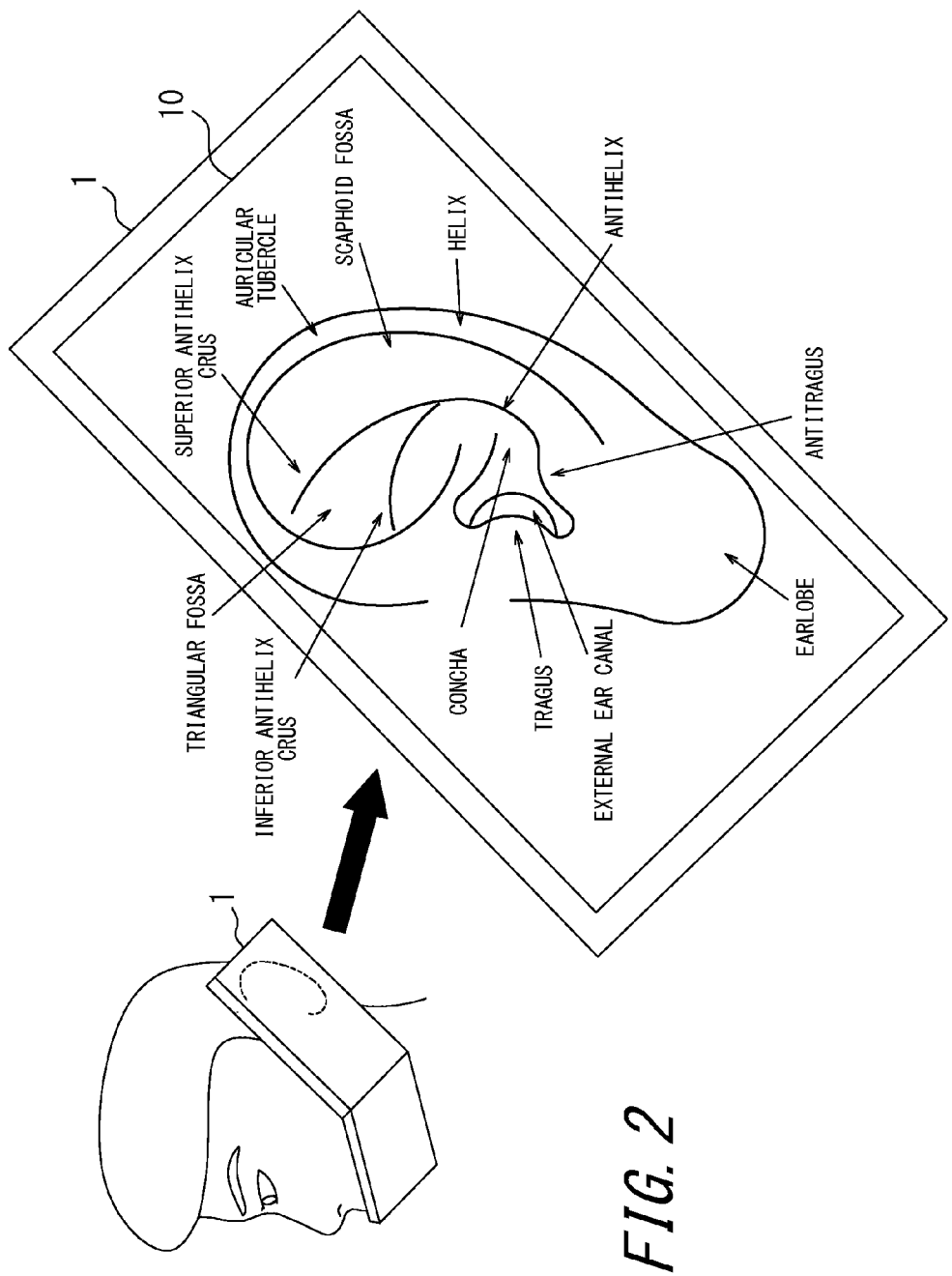
FIG. 2 is a diagram illustrating a preferred shape of a panel.

Here, the panel 10 may be in size approximately similar to the user's ear. Or, as illustrated in FIG. 2, the panel 10 may be larger than the user's ear. In this case, when the user listens to the sound, since the entire ear is likely to be covered by the panel 10 of the electronic apparatus 1, less surrounding sounds (noises) may enter the ear canal. The panel 10 needs to vibrate in a region larger than a region having a length corresponding to a distance from the inferior antihelix crus (the lower antihelix crus) to the antitragus and a width corresponding to a distance from the tragus and the antihelix. Preferably, the panel 10 vibrates in a region having a length corresponding to a distance from an area in the vicinity of the superior antihelix crus (the upper antihelix crus) of the helix to the lobe and a width corresponding to a distance from the tragus to an area in the vicinity of the antihelix of the helix. The region having the length and the width described above may be in a rectangular shape, or in an oval shape having the above length as a long diameter and the above width as a short diameter. An average ear size of Japanese people may be obtained from Database of Japanese Body Size (1992-1994) provided by Research Institute of Human Engineering for Quality Life (HQL). When the panel 10 is equal to or larger than the average ear size of Japanese people, it is considered that the panel 10 may cover most of foreign nationals' entire ears.

The electronic apparatus 1 described above, by vibrating the panel 10, may deliver the air conduction sound and the human body vibration sound via a part of the user's body (for example, the cartilage of the outer ear). Therefore, when sound at a volume similar to that of a conventional dynamic receiver is output, less sound is transmitted around the electronic apparatus 1 through air vibration by the vibration of the panel 10 as compared with that of the dynamic receiver. Accordingly, the electronic apparatus 1 is suitable for listening to, for example, a recorded message on a train or the like.

Also, since the electronic apparatus 1 described above delivers the human body vibration sound by vibrating the panel 10, when the user is wearing, for example, earphones or headphones, the user may hear the sound via the earphones or the headphones and a part of the user's body by bringing the electronic apparatus 1 into contact with the earphones or the headphones.

The electronic apparatus 1 described above delivers the sound to the user by vibrating the panel 10. Therefore, when the electronic apparatus 1 does not separately include the dynamic receiver, an opening (a sound opening) for voice transmission does not need to be formed on the housing, which allows simplification of a waterproof structure of the electronic apparatus 1. Note that, when the electronic apparatus 1 has the dynamic receiver, the sound opening is preferably sealed with a material that ventilates while blocking liquid. Such a material for ventilating while blocking liquid is, for example, Gore-Tex (registered trademark).

First Embodiment

FIG. 3 are diagrams illustrating a housing structure of the electronic apparatus 1 according to a first embodiment. FIG. 3(*a*) is a front view, and FIG. 3(*b*) is a cross-sectional view taken from line b-b of FIG. 3(*a*). The electronic apparatus 1 illustrated in FIG. 3 is a smartphone having a touch panel made of a glass plate serving as the panel 10 disposed on a front side of a housing 60 (for example, a metal or resin case). The panel 10 and the input unit 40 are supported by the housing 60, and each of the display unit 20 and the piezoelectric element 30 is attached to the panel 10 by a joint member 70. The joint member 70 is a thermocurable adhesive, an ultraviolet curable adhesive, the double-sided adhesive tape and the like and may be an optical elasticity resin such as, for example, a colorless and transparent acrylic ultraviolet curable adhesive. The panel 10, the display unit 20 and the piezoelectric element 30 have substantially rectangular shapes.

The display unit 20 is disposed substantially in the center of a short direction of the panel 10. The piezoelectric element 30 is spaced apart from an end of a longitudinal direction of the panel 10 by a predetermined distance and disposed in the vicinity of the end in such a manner that a longitudinal direction of the piezoelectric element 30 faces along a short side of the panel 10. The display unit 20 and the piezoelectric element 30 are disposed side by side in a direction parallel to an internal surface of the panel 10.

Figure 4:
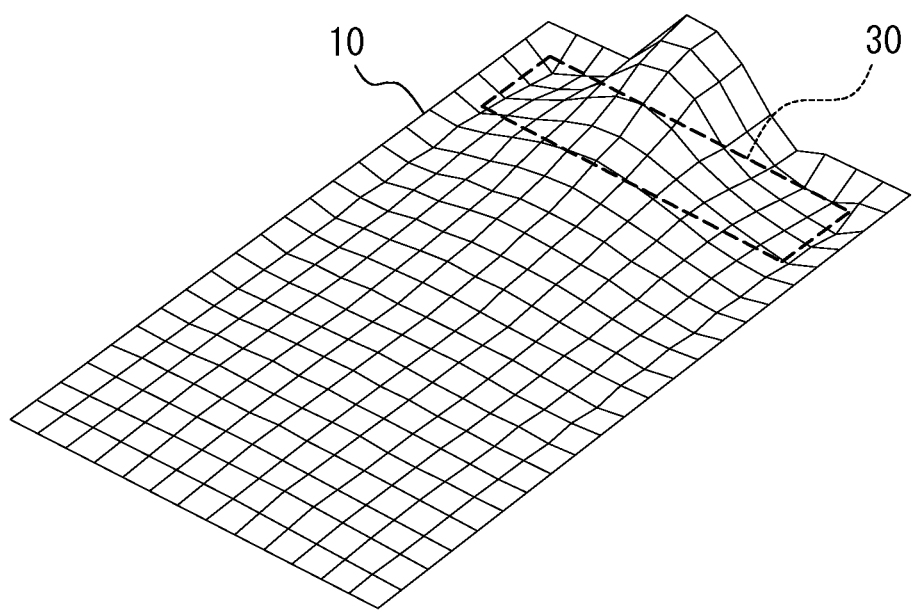
FIG. 4 is a diagram illustrating an example of vibration of a panel of the electronic apparatus according to the first embodiment.

FIG. 4 is a diagram illustrating an example of a vibration of the panel 10 of the electronic apparatus 1 according to the first embodiment. In the electronic apparatus 1 according to the first embodiment, the display unit 20 is attached to the panel 10. Therefore, a lower portion of panel 10 less vibrates than an upper portion of the panel 10 to which the piezoelectric element 30 is attached. Accordingly, sound leakage in the lower portion of the panel 10 caused by the vibration thereof may be reduced. The upper portion of the panel 10 is bent directly by the piezoelectric element 30, and the vibration attenuates in the lower portion as compared with the upper portion. The panel 10 is bent by the piezoelectric element 30 in such a manner that a region immediately above the piezoelectric element 30 in the longitudinal direction thereof rises the most as compared with its surroundings.

According to the electronic apparatus 1 of the present embodiment, as described above, the panel 10 deforms due to the deformation of the piezoelectric element 30 attached to the rear surface of the panel 10 and delivers the air conduction sound and the human body vibration sound to an object in contact with the panel 10 that is deforming. Thus, without the necessity to protrude the vibrator on an outer surface of the housing 60, the air conduction sound and the human body vibration sound may be delivered to the user. Also, since there is no need to bring the piezoelectric element itself into contact with the user's ear, the piezoelectric element 30 is unlikely to be damaged. Further, deformation of the housing 60 in place of the panel 10 is likely to cause the user to drop a terminal upon generation of the vibration, whereas the vibration of the panel 10 is less likely to cause such an accident.

Second Embodiment

FIG. 5 are diagrams illustrating a housing structure of the electronic apparatus 1 according to a second embodiment. FIG. 5(*a*) is a front view, and FIG. 5(*b*) is a cross-sectional view taken from line b-b of FIG. 5(*a*). FIG. 5(*c*) is a cross-sectional view taken from line c-c of FIG. 5(*a*). The electronic apparatus 1 illustrated in FIG. 5 is a folding mobile phone terminal having a cover panel (acryl plate) serving as the panel 10 for protecting the display unit 20 disposed on a front side of an upper portion of the housing 60. According to the second embodiment, the intermediate member 80 is disposed between the panel 10 and the piezoelectric element 30. For example, the intermediate member 80, for the purpose of reducing damage to the piezoelectric element by external force, may function as a member for alleviating transmission of the external force to the piezoelectric element 30. Also, the intermediate member 80 may function as a member for reducing excessive deformation of the piezoelectric element. The intermediate member 80 is, for example, an elastic member such as rubber or silicon. Or, the intermediate member 80 may be made of, for example, a conductive material. The intermediate member 80 may be, for example, a copper plate, a steel plate, or a phosphor bronze plate. Or, the intermediate member 80 may be a metal plate made of, for example, aluminum and the like having a certain degree of elasticity. The intermediate member 80 may be a stainless steel plate such as, for example, SUS304. The intermediate member 80 may be made up of a plurality of types of metals such as, for example, a metal plate made up of silver-plated copper plate, a plate including a lamination of a copper plate and an aluminum plate, or the like. A thickness of the metal plate such as the stainless steel plate or the like is preferably, for example, 0.2 mm to 0.8 mm based on the voltage or the like applied to the piezoelectric element 30. Or, the intermediate member 80 may be, for example, a resin plate. Here, resin forming the resin plate may be, for example, a polyamide resin. As the polyamide resin, there is, for example, Lenny (registered trademark) made of a crystalline thermoplastic resin obtained from m-xylylenediamine and adipic acid having high strength and elasticity. As such a polyamide resin, a reinforced resin containing the polyamide resin itself as a base polymer and reinforced by glass fibers, metal fibers, or carbon fibers may be used. According to an amount of the glass fibers, the metal fibers, or the carbon fibers added to the polyamide resin, the strength and the elasticity are appropriately adjusted. The reinforced resin described above is formed by, for example, impregnating a substrate formed by knitting the glass fibers, the metal fibers, or the carbon fibers with the resin and then allowing the resulting material to cure. Or, the reinforced resin may be formed by mixing fine fiber pieces into a liquid resin and allowing the resin to cure. Or, the reinforced resin may be composed of a lamination of the substrate formed of knitted fibers and a resin layer.

That is, the electronic apparatus 1 according to the second embodiment has a structure in which the piezoelectric element 30 and the intermediate member 80 are attached together by the joint member 70 and, further, the intermediate member 80 and the panel 10 are attached together by the joint member 70. According to the second embodiment, also, the display unit 20 is supported by the housing 60 instead of being attached to the panel 10. That is, the electronic apparatus 1 according to the second embodiment has a structure in which the display unit 20 is spaced apart from the panel 10, and the display unit 20 and a supporting portion 90, which is a portion of the housing 60, are attached together by the joint member 70. Note that the supporting portion 90 may be either the portion of the housing 60 or a metal or resin member separate from the housing 60.

Figure 6:
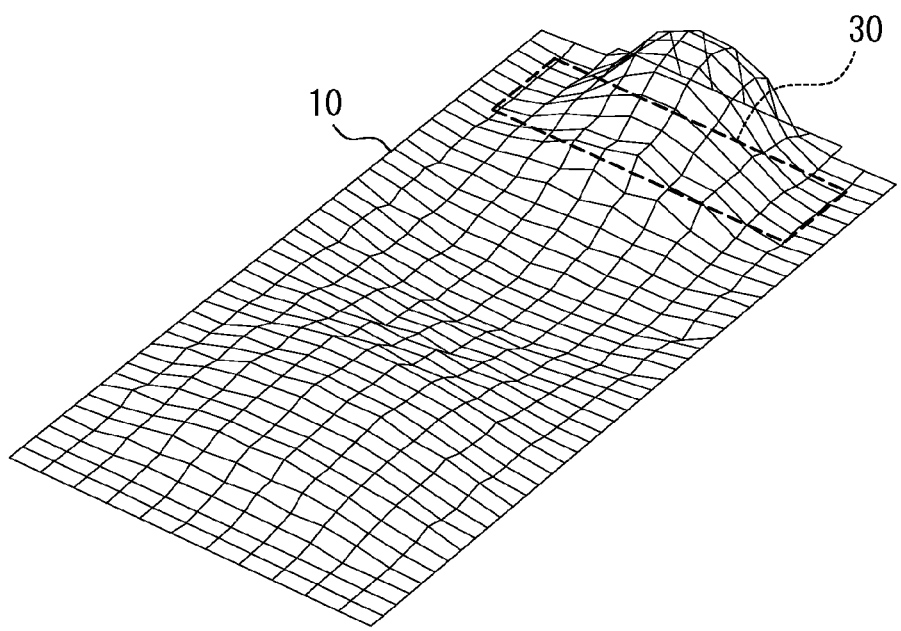
FIG. 6 is a diagram illustrating an example of vibration of a panel of the electronic apparatus according to the second embodiment.

FIG. 6 is a diagram illustrating an example of a vibration of the panel 10 of the electronic apparatus 1 according to the second embodiment. In the electronic apparatus 1 according to the second embodiment, since the panel 10 is an acrylic plate having lower rigidity than that of the glass plate and, also, the display unit 20 is not attached to the rear surface of the panel 10, amplitude generated by the piezoelectric element 30 is larger than that of the electronic apparatus 1 according to the first embodiment illustrated in FIG. 4. Also, the panel 10 vibrates in the attaching region having the piezoelectric element 30 attached thereto, as well as in the region remote from the attaching region. Accordingly, the user may hear the air conduction sound via the air and also the human body vibration sound by bringing any region of the panel 10 into contact with the ear.

According to the electronic apparatus 1 of the present embodiment, as described above, due to the deformation of the piezoelectric element 30 attached to the rear surface of the panel 10 via the intermediate member 80, the intermediate member 80 and the panel 10 deform, thereby delivering the air conduction sound and the human body vibration sound to an object in contact with the panel 10 that is deforming. Accordingly, without the necessity to protrude the vibrator on the outer surface of the housing 60, the air conduction sound and the human body vibration sound may be delivered to the user. Also, the vibration generated by the stretch or bend of the piezoelectric element 30 is delivered first to the intermediate member 80 and then to the panel 10. That is, the piezoelectric element 30 first vibrates the intermediate member 80 having an elastic modulus greater than that of the piezoelectric element 30 and then vibrates the panel 10. Therefore, as compared with a structure in which the intermediate member 80 is not provided and the piezoelectric element 30 is attached to the panel 10 by the joint member 70, deformation of the piezoelectric element 30 is unlikely to become excessive. Accordingly, a deformation amount (a degree of deformation) of the panel 10 may be adjusted. Such a structure is effective especially when the panel 10 hardly inhibits the deformation of the piezoelectric element 30.

The intermediate member 80 also serves as a member for alleviating the transmission of the external force to the piezoelectric element 30. Thus, damage to the piezoelectric element by the external force may be reduced. For example, when the electronic apparatus 1 is dropped to the ground and the external force is applied to the panel 10, the external force is transmitted first to the intermediate member 80. The intermediate member 80 has predetermined elasticity and elastically deforms due to the external force transmitted from the panel 10. Thereby, at least a part of the external force applied to the panel 10 is absorbed by the intermediate member 80, and thus the external force transmitted to the piezoelectric element 30 is reduced. As a result, damage to the piezoelectric element 30 may be reduced. Further, with the intermediate member 80 disposed between the piezoelectric element 30 and the housing 60, a possibility that, when the electronic device 1 drops to the ground and the housing 60 deforms, the deformed housing 60 hits and damages the piezoelectric element 30 may be reduced.

The intermediate member 80 also serves as a member for reducing the excessive deformation of the piezoelectric element. Thereby, excessive deformation of the piezoelectric element may be reduced. For example, the vibration generated by the stretch or bend of the piezoelectric element 30 is delivered first to the intermediate member 80 and then to the panel 10. That is, the piezoelectric element 30 first vibrates the intermediate member 80 having the elastic modulus greater than that of the piezoelectric element 30 and then vibrates the panel 10. Therefore, as compared with the structure in which the intermediate member 80 is not provided and the piezoelectric element 30 is attached to the panel 10 by the joint member 70, the excessive deformation of the piezoelectric element 30 is less likely to occur. Accordingly, the deformation amount (the degree of deformation) of the panel 10 may be adjusted. Such a structure is effective especially when the panel 10 hardly inhibits the deformation of the piezoelectric element 30.

Also, the panel 10 vibrates in any region thereof including the attaching region having the piezoelectric element 30 attached thereto so as to deliver the air conduction sound and the human body vibration sound. Accordingly, the user may hear the air conduction sound via the air and also the human body vibration sound by bringing any region of the panel 10 into contact with the ear.

Further, the intermediate member 80 is disposed between the panel 10 and the piezoelectric element 30, and the piezoelectric element 30 and the intermediate member 80 are attached together by the joint member 70. When the intermediate member 80 is disposed outside the piezoelectric element 30 with respect the panel 10, the deformation of the piezoelectric element 30 is delivered via the joint member 70. On the other hand, when the intermediate member 80 is disposed between the panel 10 and the piezoelectric element 30, there is an advantage that the deformation of the piezoelectric element 30 is directly delivered to the intermediate member 80 and thus interfacial peeling of the joint member 70 between the piezoelectric element 30 and the intermediate member 80 hardly occurs.

Further, when the intermediate member 80 is made of the resin plate as described above, there is an advantage that the intermediate member 80, as compared with the intermediate member 80 made of the metal plate, is less likely to plastically deform, and thus acoustic characteristics are hardly changed. Further, as compared with the intermediate member 80 made of sheet metal, the intermediate member 80 made of the resin plate hardly affects characteristics of an antenna (not shown) provided to the electronic device 1.

Further, when using the intermediate member 80 made of various metal plates as described above and, for example, the intermediate member 80 is disposed in the vicinity of a region where the housing 60 and the panel 10 contact with each other and, simultaneously, electrically connected to a reference potential portion (GND, not shown), static electricity entering the electronic apparatus 1 from, for example, a gap between the housing 60 and the panel 10 may be led to the reference potential portion. Thereby, a possibility to damage electronic components inside the electronic apparatus 1 may be reduced. Or, when the intermediate member 80 is made of the stainless steel plate or the phosphor bronze plate, electrical connection of the stainless steel plate or the phosphor bronze plate to a power feeding portion (not shown) allows the intermediate member 80 to function as an antenna element.

Further, the intermediate member 80 is attached to the panel 10 by the joint member 70. Therefore, the intermediate member 80 may be attached to the panel 10 in such a manner as to hardly inhibit a degree of freedom of the deformation of the piezoelectric element 30. The joint member 70 may be a non-thermocurable adhesive, which offers an advantage that, during curing, thermal stress shrinkage is hardly generated between the piezoelectric element 30 and the panel 10. Or, the joint member 70 may be the double-sided adhesive tape, which offers an advantage that shrinkage stress, which is caused in using the adhesive, is hardly applied between the piezoelectric element 30 and the panel 10.

Although the present invention has been described based on the figures and the embodiments, it is to be understood that various changes and modifications may be implemented based on the present disclosure by those who are ordinarily skilled in the art. Accordingly, such changes and modifications are included in a scope of the present invention. For example, functions and the like included in each member, each step and the like may be rearranged without logical inconsistency, so as to combine a plurality of components or steps together or to divide them.

For example, according to the first embodiment and the second embodiment described above, although the intermediate member 80 is a plate-like member, the shape of the intermediate member 80 is not limited thereto. The intermediate member may have, for example, a shape larger than the piezoelectric element 30 with an end curving around and covering a side portion of the piezoelectric element 30. Or, the intermediate member may have a shape having a plate-like portion and an extended portion extending from the plate-like portion to cover the side portion of the piezoelectric element 30. In this case, the extended portion and the side portion of the piezoelectric element are preferably spaced apart by a predetermined distance. Thereby, the extended portion is less likely to inhibit the deformation of the piezoelectric element.

Figure 7:
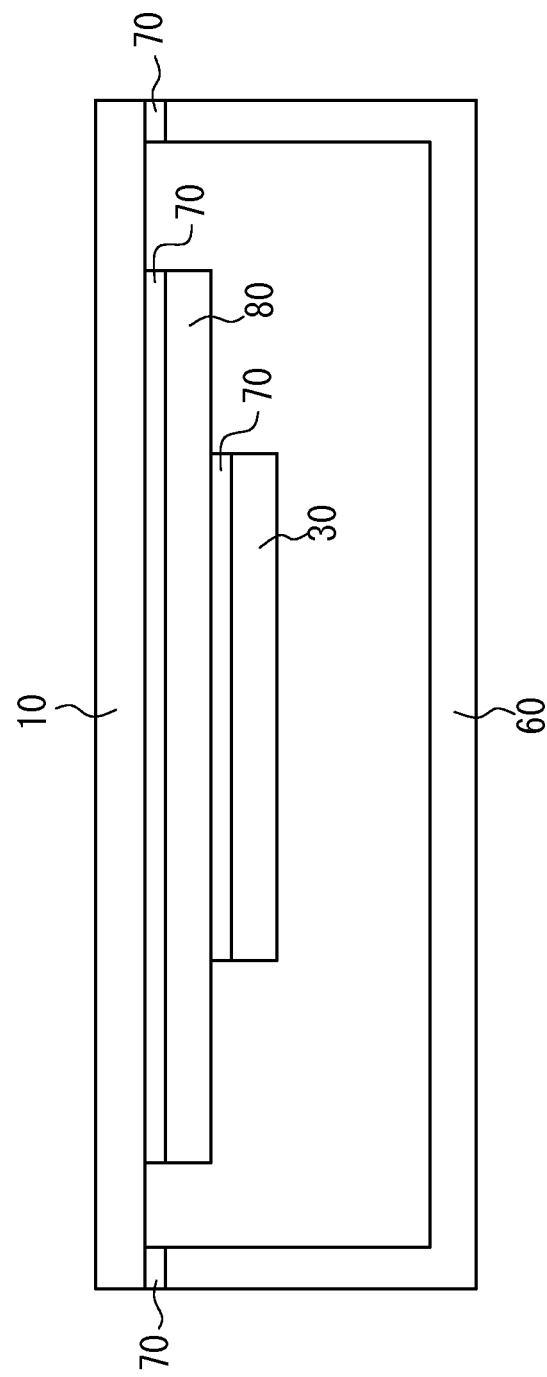
FIG. 7 is a diagram illustrating an example of attachment of the panel and a housing.

As illustrated in FIG. 7, for example, the panel 10 may be attached to the housing 60 by the joint member 70. Thereby, the vibration from the panel 10 is hardly delivered in a direct manner to the housing 60 and, as compared with a structure in which the housing 60 itself greatly vibrates, a risk that the user drops the electronic apparatus 1 may be reduced. Also, the joint member 70 may be a non-thermocurable adhesive, which offers an advantage that, during curing, the thermal stress shrinkage is hardly generated between the housing 60 and the panel 10. Or, the joint member 70 may be the double-sided adhesive tape, which offers an advantage that shrinkage stress, which is caused in using the adhesive, is hardly applied between the housing 60 and the panel 10.

For example, when the electronic apparatus 1 has a structure in which the panel 10 and the display unit 20 do not overlap each other, the piezoelectric element 30 may be disposed in the center of the panel 10. When the piezoelectric element 30 is disposed in the center of the panel 10, the vibration of the piezoelectric element 30 is delivered equally to the entire panel 10, whereby quality of the air conduction sound may be improved and the user may recognize the human body vibration sound by bringing various regions of the panel 10 into contact with the ear. Similarly to the above embodiment, any number of the piezoelectric elements 30 may be attached.

Also, although in the electronic apparatus 1 described above the piezoelectric element 30 is attached to the panel 10, the piezoelectric element 30 may be attached elsewhere. For example, the piezoelectric element 30 may be attached to a battery lid that is attached to the housing 60 for covering a battery. In the electronic apparatus 1 such as the mobile phone terminal and the like, since the battery lid is often attached to a plane different from a plane having the panel 10, such structure allows the user to hear the sound by bringing a surface other than the one with the panel 10 into contact with a part of the body (for example, the ear).

Further, the panel 10 may partially or entirely constitute any one of a display panel, an operation panel, the cover panel, a lid panel for allowing removal of the battery. Especially, when the panel 10 constitutes the display panel, the piezoelectric element 30 is disposed outside a display area for executing a display function. This offers an advantage that a display is hardly inhibited.

REFERENCE SIGNS LIST 1 electronic apparatus
10 panel
20 display unit
30 piezoelectric element
40 input unit
50 control unit
60 housing
70 joint member
80 intermediate member
90 supporting portion Technical Problem According to the electronic apparatus described in Patent Document 1, a vibrator is attached to the outer surface of the housing of the mobile phone and the like. Therefore, there is no consideration about a problem of the electronic apparatus that vibrates the panel attached to the housing.

An object of the present invention is to provide an electronic apparatus that vibrates the panel attached to the housing and may be used satisfactorily.

Solution to Problem

The present invention provides an electronic apparatus including a piezoelectric element, a panel that is vibrated by the piezoelectric element and thus generates an air conduction sound and a vibration sound delivered by vibration of a part of a human body, and a housing having the panel mounted thereon, wherein the piezoelectric element and the panel are attached together at both ends of a longitudinal direction of the piezoelectric element.

Effect of the Invention

According to the present invention, an electronic apparatus that vibrates the panel attached to the housing and may be used satisfactorily, and a unit for electronic apparatus used for such an electronic apparatus may be provided.

First Embodiment

Figure 8A:
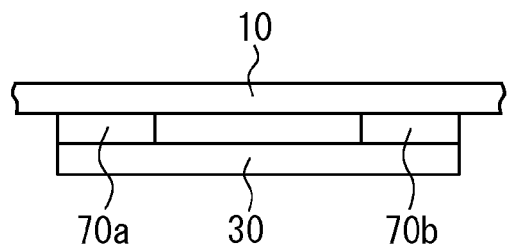
FIGS. 8(a), (b), and (c) are partial cross-sectional diagrams illustrating the housing structure of the electronic apparatus according to the first embodiment, a variation of the housing structure, and a comparative example of the housing structure, respectively.
Figure 8B:
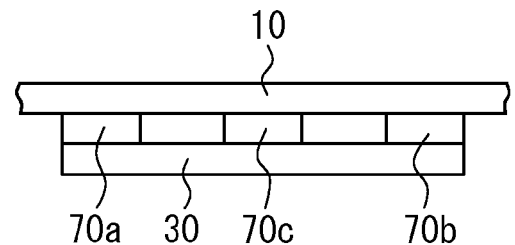
Figure 8C:
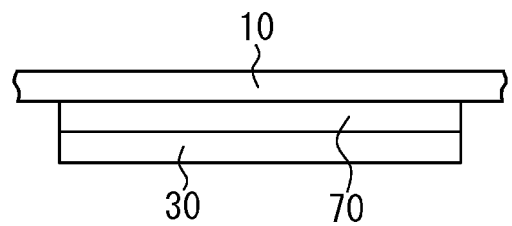
Figure 9A:
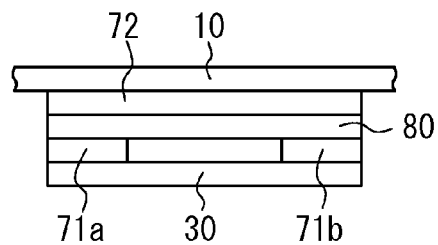
FIGS. 9(a), (b) to (c), and (d) are partial cross-sectional diagrams illustrating the housing structure of the electronic apparatus according to the second embodiment, variations of the housing structure, and a comparative example of the housing structure, respectively.
Figure 9B:
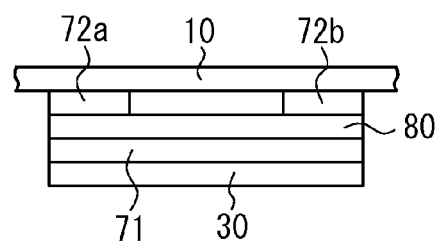
Figure 9C:
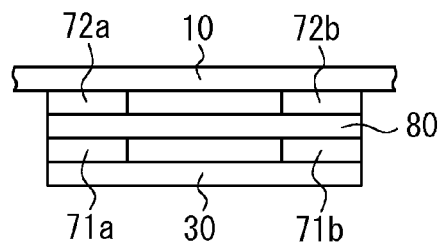
Figure 9D:
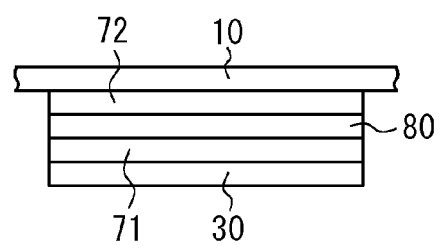

FIG. 3 are diagrams illustrating a housing structure of the electronic apparatus 1 according to the first embodiment. FIG. 3(a) is a front view. FIG. 3(b) is a cross-sectional view taken from line b-b of FIG. 3(a). FIG. 8(a) is a partial cross-sectional view taken from line b-b of FIG. 3(a). FIG. 8(b) is a partial cross-sectional view of a variation of FIG. 8(a). FIG. 8(c) is a partial cross-sectional view illustrating a structure as a comparative example of a structure of FIG. 8(a). The electronic apparatus 1 illustrated in FIG. 3 and FIG. 8 is a smartphone having a touch panel made of a glass plate serving as the panel 10 disposed on a front side of a housing 60 (for example, a metal or resin case). The panel 10 and the input unit 40 are supported by the housing 60, and each of the display unit 20 and the piezoelectric element 30 is attached to the panel 10 by a joint component 70. The joint component 70 is a thermocurable adhesive, an ultraviolet curable adhesive, the double-sided adhesive tape and the like and may be an optical elasticity resin such as, for example, a colorless and transparent acrylic ultraviolet curable adhesive. The panel 10, the display unit 20 and the piezoelectric element 30 have substantially rectangular shapes.

As illustrated in FIG. 8(a), the joint component 70 includes a pair of joint members 70a, 70b. The pair of joint members 70a, 70b support both ends of a longitudinal direction of the piezoelectric element 30. Thereby, as compared with the joint component 70 attached to the entire piezoelectric element 30 as illustrated in FIG. 8(c), a degree of freedom of stretch of the piezoelectric element 30 in the longitudinal direction is hardly inhibited. Accordingly, as compared with the joint component 70 attached to the entire piezoelectric element 30, amplitude of the panel may be increased.

Between the pair of joint members 70a, 70b, an air space may be interposed. Or, the piezoelectric element 30 and the panel 10 do not need to be attached together but one of them may have a sponge, an electronic component and the like attached thereto.

In FIG. 8(b), the joint component 70 includes three joint members 70a, 70b, and 70c. In addition to the pair of joint members 70a, 70b, the joint member 70c is provided therebetween. The joint members 70a, 70b, and 70c support the piezoelectric element 30 at respective joint regions in the longitudinal direction of the piezoelectric element 30. Thereby, as compared with the joint component 70 attached to the entire piezoelectric element 30 as illustrated in FIG. 8(c), the degree of freedom of stretch of the piezoelectric element 30 in the longitudinal direction is hardly inhibited. Accordingly, as compared with the joint component 70 attached to the entire piezoelectric element 30, amplitude of the panel may be increased.

Note that, although the structure illustrated in FIG. 8(a) inhibits the expansion the least, joint strength of this structure is weak. Accordingly, it is preferable that, by designing levels of the degree of the freedom of the stretch and the joint strength, the number of the joint members, a length of each of the joint members, a length of the air space in the longitudinal direction in the absence of the joint member, and adhesion of the joint member are appropriately determined.

The display unit 20 is disposed substantially in the center of a short direction of the panel 10. The piezoelectric element 30 is spaced apart from an end of a longitudinal direction of the panel 10 by a predetermined distance and disposed in the vicinity of the end in such a manner that a longitudinal direction of the piezoelectric element 30 faces along a short side of the panel 10. The display unit 20 and the piezoelectric element 30 are disposed side by side in a direction parallel to an internal surface of the panel 10.

FIG. 4 is a diagram illustrating an example of a vibration of the panel 10 of the electronic apparatus 1 according to the first embodiment. In the electronic apparatus 1 according to the first embodiment, the display unit 20 is attached to the panel 10. Therefore, a lower portion of panel 10 less vibrates than an upper portion of the panel 10 to which the piezoelectric element 30 is attached. Accordingly, sound leakage in the lower portion of the panel 10 caused by the vibration thereof may be reduced.

According to the electronic apparatus 1 of the present embodiment, as described above, the panel 10 deforms due to the deformation of the piezoelectric element 30 attached to the rear surface of the panel 10 and delivers the air conduction sound and the vibration sound to an object in contact with the panel 10 that is deforming. Thus, without the necessity to protrude the vibrator on an outer surface of the housing 60, the air conduction sound and the vibration sound may be delivered to the user. Also, since there is no need to bring the piezoelectric element itself into contact with the user's ear, the piezoelectric element 30 is unlikely to be damaged. Further, deformation of the housing 60 in place of the panel 10 is likely to cause the user to drop a terminal upon generation of the vibration, whereas the vibration of the panel 10 is less likely to cause such an accident.

Second Embodiment

FIG. 5 are diagrams illustrating a housing structure of the electronic apparatus 1 according to a second embodiment. FIG. 5(*a*) is a front view. FIG. 5(*b*) is a cross-sectional view taken from line b-b of FIG. 5(*a*). FIG. 9(*a*) is a partial cross-sectional view taken from line c-c of FIG. 5(*a*). FIGS. 9(*b*), (*c*) are partial cross-sectional views illustrating variations of FIG. 9(*a*). FIG. 9(*d*) is a partial cross-sectional view illustrating a structure as a comparative example of a structure of FIG. 9(*a*). The electronic apparatus 1 illustrated in FIG. 5 and FIG. 9 is a folding mobile phone terminal having a cover panel (acryl plate) serving as the panel 10 for protecting the display unit 20 disposed on a front side of an upper portion of the housing 60. According to the second embodiment, an intermediate member 80 for alleviating transmission of external force to the piezoelectric element 30 is disposed between the panel 10 and the piezoelectric element 30.

The intermediate member 80 is, for example, an elastic member such as rubber or silicon. Or, the intermediate member 80 may be, for example, a metal plate made of, for example, aluminum and the like having a certain degree of elasticity. Or, the intermediate member 80 may be, for example, a resin plate. Here, the resin forming the resin plate may be, for example, a polyamide resin. As the polyamide resin, there is, for example, Lenny (registered trademark) made of a crystalline thermoplastic resin obtained from m-xylylenediamine and adipic acid and having high strength and elasticity. As such a polyamide resin, a reinforced resin containing the polyamide resin itself as a base polymer and reinforced by glass fibers, metal fibers, or carbon fibers may be used. According to an amount of the glass fibers, the metal fibers, or the carbon fibers added to the polyamide resin, the strength and the elasticity are appropriately adjusted. The reinforced resin described above is formed by, for example, impregnating a substrate formed by knitting the glass fibers, the metal fibers, or the carbon fibers with the resin and then allowing the resulting material to cure. Or, the reinforced resin may be formed by mixing fine fiber pieces into a liquid resin and allowing the resin to cure. Or, the reinforced resin may be composed of a lamination of the substrate formed of knitted fibers and a resin layer.

The electronic apparatus 1 according to the second embodiment has a structure in which the piezoelectric element 30 and the intermediate member 80 are attached together by a first joint component 71 and, further, the intermediate member 80 and the panel 10 are attached together by a second joint component 72. According to the second embodiment, also, the display unit 20 is supported by the housing 60 instead of being attached to the panel 10. That is, the electronic apparatus 1 according to the second embodiment has a structure in which the display unit 20 is spaced apart from the panel 10, and the display unit 20 and a supporting portion 90, which is a portion of the housing 60, are attached together by the joint component 70. Note that the supporting portion 90 may be either the portion of the housing 60 or a metal or resin member separate from the housing 60.

Here, as illustrated in FIG. 9(*a*), the first joint component 71 for attaching the piezoelectric element 30 and the intermediate member 80 together may be made up of a pair of joint members 71*a*, 71*b*. The pair of joint members 71*a*, 71*b* support both ends of the longitudinal direction of the piezoelectric element 30. Between the pair of joint members 71*a*, 71*b*, the air space may be interposed. Or, the piezoelectric element 30 and the intermediate member 80 do not need to be attached together but one of them may have the sponge, the electronic component and the like attached thereto.

Note that the second joint component 72 for attaching the intermediate member 80 and the panel 10 together attaches a substantially entire surface of the intermediate member 80 to the panel 10. Such a structure, as compared with a structure in which the joint component 71 is attached to the entire surface of the piezoelectric element as illustrated in FIG. 9(*d*), hardly inhibits the degree of the freedom of the stretch of the piezoelectric element in the longitudinal direction thereof. Therefore, as compared with the case in which the entire surface of the piezoelectric element 30 is attached, the amplitude of the panel may be increased. As compared with the structure in FIG. 9(*d*), the structure in FIG. 9(*a*) had amplitude of the panel at most 22% greater.

As illustrated in FIG. 9(*b*), also, the second joint component 72 for attaching the panel 10 and the intermediate member 80 is made up of a pair of joint members 72*a*, 72*b*. The pair of joint members 72*a*, 72*b* support both ends of a longitudinal direction of the intermediate member 80. Between the pair of joint members 72*a*, 72*b*, the air space may be interposed. Or, the piezoelectric element 30 and the intermediate member 80 do not need to be attached together but one of them may have the sponge, the electronic component and the like attached thereto.

Note that the first joint component 71 for attaching the intermediate member 80 and the piezoelectric element 30 together attaches a substantially entire surface of the intermediate member 80 to the piezoelectric element 30. Such a structure, as compared with a structure in which the second joint component 72 is attached to the entire surface of the intermediate member 80 as illustrated in FIG. 9(*d*), hardly inhibits the degree of the freedom of expansion of the intermediate member 80 in the longitudinal direction thereof. Accordingly, the degree of the freedom in the longitudinal direction of the piezoelectric element 30 is hardly inhibited. Therefore, as compared with the case in which the entire surface of the intermediate member 80 is attached, the amplitude of the panel may be increased. As compared with the structure in FIG. 9(*d*), the structure in FIG. 9(*b*) had amplitude of the panel at most 24% greater.

Or, as illustrated in FIG. 9(*c*), the first joint component 71 for attaching the piezoelectric element 30 and the intermediate member 80 together may be made up of the pair of joint members 71*a*, 71*b*. The pair of joint members 71*a*, 71*b* support both ends of the longitudinal direction of the piezoelectric element 30. Also, the second joint component 72 for attaching the panel 10 and the intermediate member 80 together may be made up of the pair of joint members 72*a*, 72*b*. The pair of joint members 72*a*, 72*b* support both ends of the longitudinal direction of the intermediate member 80.

Such a structure, as compared with a structure in which the second joint component 72 is attached to the entire surface of the piezoelectric element 30 and the entire surface of the intermediate member 80 as illustrated in FIG. 9(*d*), hardly inhibits the degrees of the freedom of the stretch of the piezoelectric element 30 and the intermediate member 80 in the longitudinal directions thereof. Therefore, as compared with the case in which the entire surface of the piezoelectric element 30 and the entire surface of the intermediate member 80 are attached, the amplitude of the panel may be increased. As compared with the structure in FIG. 9(*d*), the structure in FIG. 9(*c*) had amplitude of the panel at most 14% greater.

FIG. 6 is a diagram illustrating an example of a vibration of the panel 10 of the electronic apparatus 1 according to the second embodiment. In the electronic apparatus 1 according to the second embodiment, since the panel 10 is an acrylic plate having lower rigidity than that of the glass plate and, also, the display unit 20 is not attached to the rear surface of the panel 10, amplitude generated by the piezoelectric element 30 is larger than that of the electronic apparatus 1 according to the first embodiment illustrated in FIG. 4. Also, the panel 10 vibrates in the attaching region having the piezoelectric element 30 attached thereto, as well as in the region remote from the attaching region. Accordingly, the user may hear the air conduction sound via the air and also the vibration sound by bringing any region of the panel 10 into contact with the ear.

According to the electronic apparatus 1 of the present embodiment, as described above, due to the deformation of the piezoelectric element 30 attached to the rear surface of the panel 10 via the intermediate member 80, the intermediate member 80 and the panel 10 deform, thereby delivering the air conduction sound and the vibration sound to an object in contact with the panel 10 that is deforming. Accordingly, without the necessity to protrude the vibrator on the outer surface of the housing 60, the air conduction sound and the vibration sound may be delivered to the user. Also, For example, when the electronic apparatus 1 is dropped to the ground and the external force is applied to the panel 10, the external force is transmitted first to the first intermediate member 80. The intermediate member 80 has predetermined elasticity and elastically deforms due to the external force transmitted from the panel 10. Thereby, at least a part of the external force applied to the panel 10 is absorbed by the intermediate member 80, and thus the external force transmitted to the piezoelectric element 30 is reduced. As a result, damage to the piezoelectric element 30 may be reduced. Further, with the intermediate member 80 disposed between the piezoelectric element 30 and the housing 60, a possibility that, when the electronic device 1 drops to the ground and the housing 60 deforms, the deformed housing 60 hits and damages the piezoelectric element 30 may be reduced.

Or, the intermediate member 80 is a member for reducing damage to the piezoelectric element 30 due to its curving. When the intermediate member 80 is provided, the piezoelectric element hardly curves and thus is unlikely to fracture or crack due to too much curving.

Or, the intermediate member 80 is a member for making total weight of the piezoelectric element 30 and the intermediate member 80 heavier than weight of the piezoelectric element 30 alone. Thereby, a specific frequency generating a dip in the amplitude may be adjusted.

Also, the panel 10 vibrates in any region thereof including the attaching region having the piezoelectric element 30 attached thereto so as to deliver the air conduction sound and the vibration sound. Accordingly, the user may hear the air conduction sound via the air and also the vibration sound by bringing any region of the panel 10 into contact with the ear.

Further, the intermediate member 80 is disposed between the panel 10 and the piezoelectric element 30, and the piezoelectric element 30 and the intermediate member 80 are attached together by the joint component 70. When the intermediate member 80 is disposed on the piezoelectric element 30 opposite to the panel 10, the deformation of the piezoelectric element 30 is delivered via the joint component 70. On the other hand, when the intermediate member 80 is disposed between the panel 10 and the piezoelectric element 30, there is an advantage that the deformation of the piezoelectric element 30 is directly delivered to the intermediate member 80 and thus interfacial peeling of the joint component 70 between the piezoelectric element 30 and the intermediate member 80 hardly occurs.

Further, the intermediate member 80 is attached to the panel 10 by the joint component 70. Therefore, the intermediate member 80 may be attached to the panel 10 in such a manner as to hardly inhibit a degree of freedom of the deformation of the piezoelectric element 30. The joint component 70 may be a non-thermocurable adhesive, which offers an advantage that, during curing, thermal stress shrinkage is hardly generated between the piezoelectric element 30 and the panel 10. Or, the joint component 70 may be the double-sided adhesive tape, which offers an advantage that shrinkage stress, which is caused in using the adhesive, is hardly applied between the piezoelectric element 30 and the panel 10.

Although the present invention has been described based on the figures and the embodiments, it is to be understood that various changes and modifications may be implemented based on the present disclosure by those who are ordinarily skilled in the art. Accordingly, such changes and modifications are included in a scope of the present invention. For example, functions and the like included in each member, each step and the like may be rearranged without logical inconsistency, so as to combine a plurality of components or steps together or to divide them.

Figure 10:
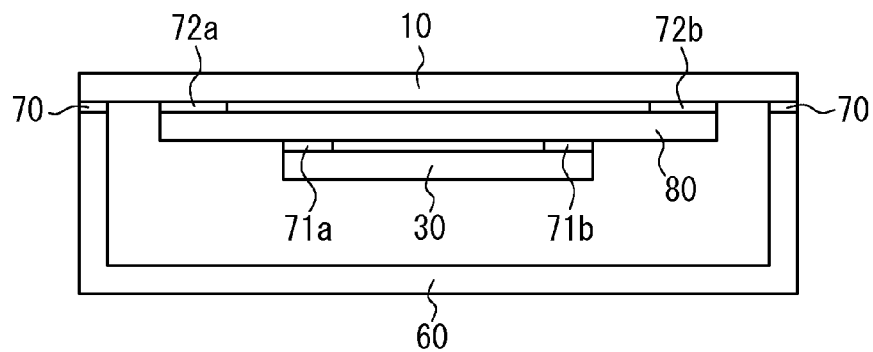
FIG. 10 is a diagram illustrating an example of the attachment of the panel and the housing.

As illustrated in FIG. 10, for example, the panel 10 may be attached to the housing 60 by the joint component 70. Thereby, the vibration from the panel 10 is hardly delivered in a direct manner to the housing 60 and, as compared with a structure in which the housing 60 itself greatly vibrates, a risk that the user drops the electronic apparatus 1 may be reduced. Also, the joint component 70 may be a non-thermocurable adhesive, which offers an advantage that, during curing, the thermal stress shrinkage is hardly generated between the housing 60 and the panel 10. Or, the joint component 70 may be the double-sided adhesive tape, which offers an advantage that shrinkage stress, which is caused in using the adhesive, is hardly applied between the housing 60 and the panel 10.

In FIG. 10, also, the piezoelectric element 30, at both ends thereof, is supported by the display panel serving as the intermediate member 80 via the pair of joint members 71*a*, 71*b*. Between the pair of joint members 71*a*, 71*b*, the air space may be interposed, for example. The piezoelectric element 30 and the panel do not need to be attached together but one of them may have the sponge, the electronic component and the like attached thereto. In this case, preferably, the panel 10 is not the display panel but a protection panel for protecting the display panel, or the touch panel.

Also, the display panel serving as the intermediate member 80 is supported by the panel 10 via the pair of joint members 72*a*, 72*b*. Between the pair of joint members 72*a*, 72*b*, the air space may be interposed, for example. The piezoelectric element 30 and the display panel do not need to be attached together but one of them may have the sponge, the electronic component and the like attached thereto. Such a structure also, as compared with a structure in which the joint component is attached to the entire surface of the piezoelectric element or an entire surface of the display panel serving as the intermediate member, hardly inhibits the degree of the freedom of the stretch of the piezoelectric element in the longitudinal direction thereof. Therefore, the amplitude of the panel may be increased.

For example, although according to the first embodiment and the second embodiment described above the intermediate member 80 is a plate-like member, the shape of the intermediate member 80 is not limited thereto. The intermediate member may have a shape larger than the piezoelectric element 30 with an end curving around and covering a side portion of the piezoelectric element 30. Or, the intermediate member may have, for example, a shape having a plate-like portion and an extended portion extending from the plate-like portion and covering the side portion of the piezoelectric element 30. In this case, the extended portion and the side portion of the piezoelectric element are preferably spaced apart by a predetermined distance. Thereby, the extended portion is less likely to inhibit the deformation of the piezoelectric element.

For example, when the electronic apparatus 1 has a structure in which the panel 10 and the display unit 20 do not overlap each other, the piezoelectric element 30 may be disposed in the center of the panel 10. When the piezoelectric element 30 is disposed in the center of the panel 10, the vibration of the piezoelectric element 30 is delivered equally to the entire panel 10, whereby quality of the air conduction sound may be improved and the user may recognize the vibration sound by bringing various regions of the panel 10 into contact with the ear. Similarly to the above embodiment, a plurality of piezoelectric elements 30 may be stacked in their thickness direction.

Also, although in the electronic apparatus 1 described above the piezoelectric element 30 is attached to the panel 10, the piezoelectric element 30 may be attached elsewhere. For example, the piezoelectric element 30 may be attached to a battery lid that is attached to the housing 60 for covering a battery. In the electronic apparatus 1 such as the mobile phone terminal and the like, since the battery lid is often attached to a plane different from a plane having the panel 10, such structure allows the user to hear the sound by bringing a surface other than the one with the panel 10 into contact with a part of the body (for example, the ear).

Further, the panel 10 may partially or entirely constitute any one of a display panel, an operation panel, the cover panel, a lid panel for allowing removal of the battery. Especially, when the panel 10 constitutes the display panel, the piezoelectric element 30 is disposed outside a display area for executing a display function. This offers an advantage that a display is hardly inhibited.

REFERENCE SIGNS LIST

1 electronic apparatus
10 panel
20 display unit
30 piezoelectric element
40 input unit
50 control unit
60 housing
70 joint component
71, 72 joint component
80 intermediate member
90 supporting portion

The invention claimed is:
1. An electronic apparatus comprising:
a panel;
a piezoelectric element;
a housing for mounting the panel; and
an intermediate member attached to the piezoelectric element, wherein
the intermediate member and the panel deform due to deformation of the piezoelectric element, thereby delivering an air conduction sound and a human body vibration sound to an object in contact with the panel that is deforming, and
the panel forms an exterior surface of the electronic device.
2. The electronic apparatus according to claim 1, wherein the intermediate member is disposed between the panel and the piezoelectric element, and
the piezoelectric element and the intermediate member are attached together by a first joint member.
3. The electronic apparatus according to claim 1, wherein the intermediate member is made of glass fibers and resin, metal fibers and resin, or carbon fibers and resin.
4. The electronic apparatus according to claim 1, wherein the panel vibrates in a region larger than a region having a length corresponding to a distance from the inferior antihelix crus of the human ear to the antitragus and a width corresponding to a distance from the tragus to the antihelix.
5. The electronic apparatus according to claim 2, wherein the intermediate member is attached to the panel by a second joint member.
6. The electronic apparatus according to claim 2, wherein the first joint member is a non-thermocurable adhesive.
7. The electronic apparatus according to claim 2, wherein the first joint member is a double-sided adhesive tape.
8. The electronic apparatus according to claim 5, wherein the second joint member is the non-thermocurable adhesive.
9. The electronic apparatus according to claim 5, wherein the second joint member is the double-sided adhesive tape.
10. The electronic apparatus according to claim 5, wherein the panel is attached to the housing by a third joint member.
11. The electronic apparatus according to claim 10, wherein the third joint member is the non-thermocurable adhesive.

12. The electronic apparatus according to claim 10, wherein the third joint member is the double-sided adhesive tape.

13. The electronic apparatus according to claim 1, wherein the panel partially or entirely constitutes any one of a display panel, an operation panel, a cover panel, and a lid panel for allowing removal of a battery.

14. The electronic apparatus according to claim 13, wherein, when the panel constitutes the display panel, the piezoelectric element is disposed outside a display area for executing a display function.

15. The electronic apparatus according to claim 1, wherein the panel deforms in any region thereof to deliver the air conduction sound and the human body vibration sound.

16. The electronic apparatus according to claim 1, wherein the panel, in a vibration area thereof, includes a plurality of locations for vibrating in a direction intersecting with a main surface of the panel, in each of which a value of amplitude of the vibration changes with time from positive to negative or vice versa.

17. The electronic apparatus according to claim 1, wherein the intermediate member is a member for reducing excessive deformation of the piezoelectric element.

18. The electronic apparatus according to claim 1, wherein the intermediate member is a member for alleviating transmission of external force to the piezoelectric element.

19. The electronic apparatus according to claim 1, wherein the intermediate member is made of metal.

20. A panel unit for an electronic device, the electronic device comprising the panel unit, the panel unit comprising:
a panel;
a piezoelectric element; and
an intermediate member attached to the piezoelectric element, wherein
the intermediate member and the panel deform due to deformation of the piezoelectric element, thereby delivering an air conduction sound and a human body vibration sound to an object in contact with the panel that is deforming, and
the panel forms an exterior surface of the electronic device.

21. The panel unit according to claim 20, wherein the intermediate member is a member for reducing excessive deformation of the piezoelectric element.

22. The panel unit according to claim 20, wherein the intermediate member is a member for alleviating transmission of external force to the piezoelectric element.

23. The panel unit according to claim 20, wherein the intermediate member is made of metal.

24. An electronic apparatus comprising:
a piezoelectric element;
a panel that is vibrated by the piezoelectric element and thereby generates an air conduction sound and a vibration sound delivered via a human body;
an intermediate member disposed between the piezoelectric element and the panel; and
a housing having the panel mounted thereon, wherein
the piezoelectric element and the intermediate member are attached together at both ends of a longitudinal direction of the piezoelectric element, and
the panel forms an exterior surface of the electronic device.

* * * * *